United States Patent [19]
Graf et al.

[11] Patent Number: 5,439,876
[45] Date of Patent: Aug. 8, 1995

[54] METHOD OF MAKING ARTIFICIAL LAYERED HIGH $T_c$ SUPERCONDUCTORS

[75] Inventors: Volker Graf, Wollerau; Carl A. Mueller, Hedingen, both of Switzerland

[73] Assignee: International Business Machines Corporation, Armonk, N.Y.

[21] Appl. No.: 108,138

[22] Filed: Aug. 16, 1993

Related U.S. Application Data

[63] Continuation of Ser. No. 772,638, Oct. 8, 1991, abandoned, and Ser. No. 360,805, Jun. 2, 1989, abandoned.

[30] Foreign Application Priority Data

Jun. 3, 1988 [EP] European Pat. Off. ............ 88108908

[51] Int. Cl.⁶ ...................... C30B 19/10; C01F 11/00; C01G 1/00
[52] U.S. Cl. .................................. 505/447; 505/473; 117/89; 117/105; 117/108
[58] Field of Search .................. 505/447, 473; 117/89, 117/105, 108

[56] References Cited

U.S. PATENT DOCUMENTS 4,058,430 11/1977 Suntola et al. ........................ 156/611
4,854,264 8/1989 Noma et al. .......................... 118/719

FOREIGN PATENT DOCUMENTS 0305292 3/1989 European Pat. Off. ............. 505/729
3810243 10/1988 Germany .............................. 505/729
2120845 12/1983 United Kingdom ......... H05B 33/22
2162862 2/1986 United Kingdom ......... C23C 16/30

OTHER PUBLICATIONS

Braginski, In-Situ Fabrication, Processing and Characterization of Superconducting Oxide Films, SPIE Proceedings vol. 948, Apr. 1988.
Liou et al, "High $T_c$ Superconducting Y-Ba-Cu-O Oxide Films by Sputtering and M.B.E. . . . ," American Vacuum Society Series 3, Nov. 6, 1987, pp. 79 to 86.
Broussard et al., "Film Growth of High Transition Temperature Superconductors" Journal of Crystal Growth, 91 (1988), pp. 340-345.
Berry et al., "Growth of Superconducting Thin Films of Bi-Sr-Ca-CuO by Organometallic C.V.D.," Journal of Crystal Growth, 92 (1988) pp. 344-347.
H. Nelson, *RCA Review* vol. 24, pp. 603-615 (Dec. 1963).
A. C. Gossard, *Thin Solid Films* vol. 57, pp. 3-13 (1979).
K. Ploog, in *Crystals: Growth, Properties and Applications* H. C. Freyhardt, ed. (Springer Verlag, 1980) pp. 73-163.
K. Ploog *Ann. Rev. Mater. Sci.* vol. 11, pp. 171-210 (1981).
I. Brodie and J. J. Murray *The Physics of Microfabrication* (Plenum, 1982) pp. 16-19, 349-358, 471-474, 484-487.
O. M. Parkash et al. *Physica Status Solidi (a)* vol. 96, pp. K79-K83 (Jul. 1986).
M. A. Tischler and S. M. Bedair *Journal of Crystal Growth* vol. 77, pp. 89-94 (1986).
J. G. Bednorz and K. A. Muller *Z. Phys. B.-Condensed Matter* vol. 64, pp. 189-193 (1986).
Y. Sorimachi et al. *Japanese J. Appl. Phys.* vol. 26 pp. L1451-L1452 (Sep. 1987).
C. Webb et al. *Appl. Phys. Lett.* vol. 51 pp. 1191-1193 (12 Oct. 1987).
J. Kwo et al. in *Novel Superconductivity* S. A. Wolf and V. Z. Kresin, eds. (Plenum Press, 1987) pp. 699-703.
H. Watanabe and A. Usui *Inst. Phys. Conf. Ser. No. 83*, pp. 1-8 (1987).
A. D. Berry et al. *Appl. Phys. Lett.* vol. 52 pp. 1743-1745 (16 May 1988).
P. Houdy et al. *AIP Conf. Proc. No. 165, Thin Film Processing and Characterization of High Temperature Superconductors*, Anaheim, Calif. pp. 122-129 (1988).

*Primary Examiner*—Robert Kunemund
*Attorney, Agent, or Firm*—Jackson E. Stanland; J. David Ellett, Jr.; Daniel P. Morris

[57] ABSTRACT

A method for making layered structures of artificial high $T_c$ superconductor compounds by which on top of a seed crystal having a lattice structure matching the lattice structure of the superconductor compound to be made, oxide layers of all constituent components are epitaxially grown in a predetermined sequence so as to create a sandwich structure not found in natural crystals. The epitaxial deposition of the constituent components is performed in a reaction chamber having evaporation facilities, inlets for metal-organic gases, and inlets for background gases including oxygen.

20 Claims, 5 Drawing Sheets

- ● Sr
- ○ La
- ● Cu
- ○ Ti

- ● Sr
- ○ La
- • $Cu^{2+}/Cu^{3+}$
- ○ Ti
- ⊙ Al
- ⊕ Zr

- ● Sr
- ○ La
- • Cu
- ∘ Ti
- ⊚ W

METHOD OF MAKING ARTIFICIAL LAYERED HIGH $T_c$ SUPERCONDUCTORS

This is a continuation of application Ser. No. 07/772,638, filed Oct. 8, 1991, now abandoned, and a continuation of application Ser. No. 07/360,805, filed Jun. 2, 1989, now abandoned.

This invention relates to the manufacture of artificial high $T_c$ superconductors having a layered structure by means of epitaxial growth. For the purposes of the following description, high $T_c$ superconductors shall mean those materials having a transition temperature above 30° K.

Superconductivity is usually defined as the complete loss of electrical resistance of a material at a well-defined temperature. It is known to occur in many materials: About a quarter of the elements and over 1000 alloys and compounds have been found to be superconductors. Superconductivity is considered a property of the metallic state of the material, in that all known superconductors are metallic under the conditions that cause them to superconduct. A few normally non-metallic materials, for example, become superconductive under very high pressure, the pressure converting them to metals before they become superconductors.

Superconductors are very attractive for the generation and energy-saving transport of electrical power over long distances, as materials for forming the coils of strong magnets for use in plasma and nuclear physics, in nuclear resonance medical diagnosis, and in connection with the magnetic levitation of fast trains.

Power generation by thermonuclear fusion, for example, will require very large magnetic fields which can only be provided by superconducting magnets. Certainly, superconductors will also find application in computers and high speed signal processing and data communication.

J. G. Bednorz and K. A. Müller in their paper "Possible High $T_c$ Superconductivity in the Ba-La-Cu-O System" Z.Phys.B—Condensed Matter 64, 189–193 (1986), have described a new class of superconducting materials with a transition temperature in the neighborhood of 35° K. It has meanwhile been confirmed that one precondition for the existence of high $T_c$ superconductivity in composite metallic oxides is the layered structure of the material. (In the literature, the layered structure is often referred to as being of the "$K_2NIF_4$ type" because the structure was first observed in this material).

This structure is in particular present in oxides of the general composition $RE_2TMO_4$, wherein RE stands for the rare earths (lanthanides) and TM stands for the so-called transition metals. In the compounds in question, the RE portion may be partially substituted by one member of the alkaline earth group of metals, or by a combination of the members of this alkaline earth group. The oxygen content is generally at a deficit.

For example, one such compound that meets the description given above is lanthanum copper oxide $La_2CuO_4$ in which the lanthanum—which belongs to the IIIB group of elements—is in part substituted by one member of the neighboring IIA group of elements, viz. by one of the alkaline earth metals (or by a combination of the members of the IIA group), e.g., by barium. Also, the oxygen content of the compound is incomplete such that the compound will have the general composition of $LA_{2-x}Ba_xCuO_{4-y}$, wherein $x \leq 0.3$ and $y < 0.5$.

The present invention, too, is directed to compounds having a layer-type structure. The thickness of the layers involved has been determined to be on the order of tenths of a nanometer ($10^{-10}$m), i.e., the layers are monomolecular. However, a coupling between the layers is of importance. A theoretical way of fabricating molecular sandwich structures involves the generation and subsequent etching of natural crystals of the desired composition and having a perovskitic structure, although only a very limited parameter range (chemical elements, stoichiometry) is available.

It is an object of the invention to propose a new method for making layered superconductors through growth by mono-layer epitaxy, including a variation of their stacking in order to obtain optimal conditions. The advantage of mono-layer epitaxy is the considerably greater freedom in the selection of the materials (chemical elements as well as compounds) and in the sequencing of the layers than is possible when starting from natural crystals having a perovskitic structure.

Epitaxy per se is well known, for example, I. Brodie and J. J. Murray, The Physics of Microfabrication, Plenum Press, New York and London, 1982, pp. 16. The term epitaxy describes a deposition process whereby a single-crystal material is applied to a substrate having the same crystal orientation. In order for the depositing material to atomically interface with the substrate surface, two important conditions must be met: First, the substrate surface must present to the depositing material a suitable number of nucleation sites where deposited atoms give up some energy and bond to the surface atoms; and second, the lattice match of the surface relative to the depositing material must be a maximum.

The epitaxy process is performed in a reactor chamber, usually at elevated temperatures and in an atmosphere with specially controlled pressure, or in vacuo. Depending on the mechanism by which the depositing material is replenished in the reactor chamber, three types of epitaxy processes are distinguished, viz. vapor-phase epitaxy (VPE), liquid-phase epitaxy (LPE), and molecular beam epitaxy (MBE).

In the vapor-phase epitaxy process, a gas stream containing the material to be deposited is caused to flow over the heated substrates. The growth rate of the epitaxial layer can be made a function of the concentration in the gas stream of the material to be deposited.

A prior reference to vapor-phase epitaxy is U.S. Pat. No. 4,058,430 which discloses a method for growing highly oriented compound thin films on a substrate by subjecting the substrate to the vapor of a first single element which can react with the substrate surface at a temperature sufficiently high for the reaction to occur, to form a single atomic layer of the first single element on the surface, and then subjecting the thus formed new surface to the vapor of a second single element which can react with the first single element at a temperature sufficiently high for the reaction to occur, so as to form a single atomic layer of the second single element on the surface of the first single element. This procedure is repeated until the compound film reaches the desired thickness.

In the liquid-phase epitaxy process, the material to be deposited is retained in a solution holder at elevated temperature, and is brought to contact with the substrate as the holder and the substrate are mutually displaced. With a plurality of solution holders in a row, it is possible to deposit multilayers of different materials onto the same substrate.

Liquid-phase epitaxy was, for example, described by H. Nelson, "Epitaxial Growth From the Liquid State and Its Applications to the Fabrication of Tunnel and Laser Diodes", RCA (Rev. 24 (1963) p.603. Nelson used a tipping system, where the substrate and the epitaxial solution are placed at opposite ends of a graphite boat which in turn is arranged inside a growth tube containing a high purity atmosphere. The tube is situated in a furnace that can be tipped to elevate either end of the boat. The solution used consists of gallium and gallium arsenide in such amounts that saturation occurs at the growth temperature.

The third type of epitaxy process, molecular beam epitaxy, achieves crystal growth in an ultra-high vacuum environment through the reaction of multiple beams with the heated substrate. The molecular beam sources each consist of a furnace containing one of the constituent elements of the deposit in a crucible. The furnaces are arranged so that the central portion of the beam flux distribution intersects the substrate. Shutters arranged on each of the furnaces permit the controlled initiation or cessation of the respective beam fluxes.

One example in the great volume of literature on molecular beam epitaxy is K. Ploog, "Molecular Beam Epitaxy of III-V Compounds," *Crystals: Growth, Properties and Applications*, H. C. Freyhardt, ed. (Springer-Verlag 1980) pages 73-163.

For the purposes of the present invention, advanced techniques of the three basic epitaxy processes are employed, such as metal-organic vapor-phase epitaxy (MOVPE) or chemical beam epitaxy (CBE), to grow very abrupt interfaces and, at the same time, allow the deposited layers to be very thin through precise control of the growth parameters.

The paper "Single Crystal Superconducting $Y_1Ba_2Cu_3O_7$-x Oxide Films By Molecular Beam Epitaxy" by J. Kwo, M. Hong, R. M. Fleming, T. C. Hsieh, S. H. Liou, and B. A. Davidson, published in Conference Proceedings "Novel Mechanisms of Superconductivity" Jun. 22 through 26, 1987, Berkeley, Calif., describes a method for preparing single-crystal $Y_1Ba_2Cu_3O_7$-x films by thermally coevaporating the constituents of the films from three separate sources simultaneously onto the (100) face of $SrTiO_3$. The films produced with this method are amorphous and have a reported thickness of about 900 nm.

Another reference describing "thick" films (about 1 μm) is C. Webb et al., "Growth of high $T_c$ Superconducting Films Using Molecular Beam Epitaxy Techniques", Appl. Phys. Lett. 51 (15) 1987, pp. 1191-1193. The high $T_c$ superconductor reported in this reference is $DyBa_2Cu_3O_{7-x}$ which has been grown on a $SrTiO_3$ substrate. However, in this case, as well as in the above-mentioned Kwo et al reference, the films required oxidation at elevated temperatures as a post-anneal process in order for them to become superconducting.

The present invention is, however, not directed to such thick films but rather to the formation of monolayer films, i.e. films comprising only one or very few molecular layers of a superconducting material. Of relevance in this connection is a paper by M. A. Tischler and S. M. Bedair, "Growth and Characterization of Compound Semiconductors by Atomic Layer Epitaxy", Journal of Crystal Growth 77 (1986) pp. 89-94. As described in this reference, growth proceeds by the sequential deposition of individual layers of atoms of the elements making up the final compound. For example, gallium arsenide is growth by first depositing an atomic layer of gallium and then an atomic layer of arsenic. The cycle is repeated until the desired thickness is achieved. The first atomic layer is chemically adsorbed at the substrate surface, and any following atoms are only weakly bonded and tend to re-evaporate. This is a self-limiting mechanism which prevents the deposition of more than one monolayer at a time. The second-material atomic layer finds a fresh surface and again, one monolayer of atoms gets adsorbed to that new surface. If the operational parameters are appropriate, a chemical reaction will cause the atomic monolayers to form a monomolecular layer of the desired compound.

While in the Tischler-Bedair proposal cited above the new compound is generated from pure elements, in a proposal by H. Watanabe and A. Usui "Atomic Layer Epitaxy", Inst. Phys. Conf. Ser. No. 83: Chapter I, Paper presented at Int. Symp. GaAs and Related Compounds, Las Vegas, Nev., 1986, the starting materials are metal halogenides or metalorganic compounds, such as GaCl and $Ga(CH_3)_3$, and arsine $AsH_3$.

All of the references cited above, while dealing with thin film epitaxy, do not relate to the formation of the crystallographic structure of the superconducting compound synthesized, except that, of course, some of them mention that the superconducting phase must have a layered structure of the $K_2NiF_4$ type.

SUMMARY OF THE INVENTION

In contrast, it is an object of the present invention to propose a method for making high $T_c$ superconductors having a predetermined crystallographic structure. This object is achieved by epitaxially growing sequences of atomic layers of the elements constituting the desired superconductor compound onto surfaces having a crystallographic structure at least similar to the structure of the compound being made. The superconductor structure finally achieved can comprise from one single monomolecular layer to a plurality of monomolecular layers which may make up a sandwich structure. The layers may be stacked in regular or non-regular sequences not possible in natural crystals. The non-regular sequence, in particular, may be grown in a fractal way. The fractals are determined mathematically.

A method of the invention for making artificial, layered high-$T_c$ superconductor compounds by monolayer epitaxy, is characterized by the following steps:

placing a monocrystalline substrate of a material from the group comprising strontium titanate $SrTiO_3$, zirconium dioxide $ZrO_2$, zinc telluride $Zn_{1-x}Se_x$, barium fluoride $BaF_2$ cadmium selenide $Cd_{1-x}Se_x$, and cadmium telluride $Cd_{1-x}Te_x$, wherein $x<1$, in a chamber having a plurality of independent sources of materials for epitaxial deposition, exposing said substrate in a predetermined sequence to as many different ones of said sources of constituent materials as the superconductor compounds being made should contain.

activating said sources in accordance with a predetermined pattern of activity, said pattern involving
    data determining which particular constituent material is to be deposited at any one time; data relating to the amount and concentration of the particular constituent material to be emitted from said activated source;

data relating to the period of time the exposure of said substrate to the individual constituent materials should last for one monoatomar/monomolecular layer of the particular constituent material to settle on the current substrate surface; and data relating to the operating temperature at which the exposure is to be performed, said data including information on the operating temperature of the current substrate surface, on the operating temperature of the source of the particular constituent material, and on the reaction temperature required for the desired high-$T_c$ superconductor material to form in accordance with a particular, desired crystal structure;

repeating the preceding steps as often as corresponds to the number of monomolecular/monoatomar layers the final superconductor compound should contain; and cooling the resulting crystal to ambient temperature and removing it from said chamber.

A preferred method of the invention is characterized in that the epitaxial deposition of at least part of said constituent materials is made from a gas phase. Preferably, the gas phase contains the metal atoms to be deposited in the form of an organic compound of the particular metal.

A preferred method of the invention is characterized in that the epitaxial deposition of said constituent materials is made from at least one molecular beam of the particular material(s).

To produce $La_2CuTiO_6$ by a preferred method of the invention, a monocrystalline substrate consisting of octahedral strontium titanate $SrTiO_3$ may be used. In a first epitaxial operation, a first monomolecular layer of lanthanum oxide $La_2O_3$ is deposited onto said strontium titanate substrate. In a second epitaxial operation, a layer of octahedral cuprous oxide $Cu_2O$ is deposited onto said lanthanum oxide monolayer. In a third epitaxial operation, a second monolayer of lanthanum oxide $La_2O_3$ is deposited onto said cuprous oxide layer. In a fourth epitaxial operation, a monolayer of octahedral titanium oxide $TiO_2$ is deposited onto said second lanthanum oxide monolayer. The four individual epitaxial operations are preferably performed under controlled conditions regarding time of exposure, concentration of epitaxial source material, and reaction temperature so as to permit the nascent $La_2CuTiO_6$ crystal to be stoichometrically correct and to assume a layered, octahedral structure of the ABB' type. The sequence of four epitaxial deposition operations is preferably repeated as many times as the desired thickness of the resulting superconductor compound requires.

To produce $La_2Cu(Al_{\frac{1}{2}}, Zr_{\frac{1}{2}})O_6$ by a preferred method of the invention, a monocrystalline substrate consisting of octahedral strontium titanate $SrTiO_3$ may be used. In a first epitaxial operation, a monomolecular layer of lanthanum oxide $La_2O_3$ is deposited onto said substrate. In a second epitaxial operation, a monolayer of mixed aluminum oxide $Al_2O$ and zirconium oxide $Zr^{4+}O_2$ is deposited onto said layer of lanthanum oxide. In a third epitaxial operation, a second layer of lanthanum oxide $La_2O_3$ is deposited onto said monolayer of mixed oxides. In a fourth epitaxial operation, octahedral cuprous oxide $Cu_2O$ is deposited onto said second monolayer of lanthanum oxide. The four individual epitaxial operations are preferably performed under controlled conditions regarding time of exposure, concentration of epitaxial source material, and reaction temperature so as to permit the nascent $La_2Cu(Al_{\frac{1}{2}}, Zr_{\frac{1}{2}})O_6$ crystal to be stoichometrically correct and to assure a layered, octahedral structure of the ABB' type.

To produce $Sr_2LaCu_2WO_9$ by a preferred method of the invention, a monocrystalline substrate consisting of octahedral strontium titanate $SrTiO_3$ may be used. In a first epitaxial operation, a first monomolecular layer of lanthanum oxide $La_2O_3$ is deposited onto said monocrystalline substrate. In a second epitaxial operation, a first monomolecular layer of octahedral cuprous oxide $Cu_2O$ is deposited onto said lanthanum oxide layer. In a third epitaxial operation, a first monomolecular layer of strontium oxide $SrO$ is deposited onto said monolayer of cuprous oxide. In a fourth epitaxial operation, a first monomolecular layer of tungstic oxide $WO_3$ is deposited onto said first strontium oxide monolayer. In a fifth epitaxial operation, a second monomolecular layer of strontium oxide $SrO$ is deposited onto said monomolecular layer of tungstic oxide. In a sixth epitaxial operation, a second monomolecular layer of octahedral cuprous oxide $Cu_2O$ is deposited onto said second strontium oxide layer. In a seventh epitaxial operation, a second monomolecular layer of lanthanum oxide $LaO$ is deposited onto said cuprous oxide layer. The seven individual epitaxial operations are preferably performed under controlled conditions regarding time of exposure, concentration of epitaxial source material, and reaction temperature so as to permit the nascent $Sr_2LaCu_2WO_9$ crystal structure of the AA'B type.

To produce $YBa_2Cu_3O_7$ by a preferred method of the invention, a monocrystalline substrate consisting of octahedral strontium titanate $SrTiO_3$ may be used. In a first epitaxial operation, a first monomolecular layer of yttrium oxide $Y_2O_3$ is deposited onto said monocrystalline substrate. In a second epitaxial operation, a first monomolecular layer of pyramidic cuprous oxide $Cu_2O$ is deposited onto said yttrium oxide layer. In a third epitaxial operation, a first monomolecular layer of barium oxide $BaO$ is deposited onto said monolayer of cuprous oxide $Cu_2O$. In a fourth epitaxial operation, a layer of ribbons of square planar copper oxide $CuO_4$ polyhedra is deposited onto said barium oxide layer. In a fifth epitaxial operation, a second monomolecular layer of barium oxide $BaO$ is deposited onto said layer of copper oxide polyhedra. In a sixth epitaxial operation, a second monomolecular layer of pyramidic cuprous oxide $Cu_2O$ is deposited onto said second barium oxide layer. In a seventh epitaxial operation, a second monomolecular layer of yttrium oxide is deposited onto said cuprous oxide layer. The seven individual epitaxial operations are preferably performed under controlled conditions regarding time of exposure, concentration of epitaxial source material, and reaction temperature, so as to permit the nascent $YBa_2Cu_3O_7$ crystal to be stoichometrically correct and to assume a layered, orthorhombic structure. Preferably, the first and second monolayers of yttrium oxide have a square planar structure. Preferably the $YBa_2Cu_3O_7$ crystal comprises at least two orthorhombic lattices consisting of $Ba_2Cu_3O_5$ with an interstacked square planar yttrium oxide $Y_2O_3$ layer. The cycle of seven epitaxial deposition steps is preferably repeated as often as the desired thickness of the resulting layered structure requires. Preferably, the fourth epitaxial deposition step in which a layer of copper oxide $CuO_4$ is deposited is repeated at least once prior to continuing with the fifth step of deposition to create a layered structure comprising more than one layer of copper oxide $CuO_4$ between consecutive layers of barium oxide $BaO$.

A method of the invention for making a layered high $T_c$ superconductor by monolayer deposition includes the steps of:

(a) placing a substrate in a chamber, said substrate having a desired crystallographic structure allowing substantial lattice matching to said superconductor, there being a plurality of sources in said chamber for providing the constituents of said superconductor;

(b) heating at least one of said sources to vaporize said source and to cause the constituent in said source to be deposited on said substrate as a monoatomar or monomolecular layer thereon;

(c) heating in a predetermined sequence others of said sources to vaporize said sources for deposition onto said substrate of others of said constituents as monoatomar or monomolecular layers thereon; and (d) repeating said preceding two heating steps to deposit additional monoatomar or monomolecular layers onto said substrate until the desired final superconductor is formed.

Preferably, a gas stream including oxygen may be introduced into said chamber. The vaporization may then form monomolecular oxide layers on said substrate. The sources preferably include the metal constituents to be present in said superconductor. Preferably, the superconductor contains Cu-O planes. The monoatomar or monomolecular layers are preferably epitaxially formed on said substrate. In certain preferred applications, the sequence of heating steps deposits monoatomar or monomolecular layers in a sequence other than that naturally occurring. In certain preferred applications, the superconductor has an artificial crystallographic structure.

These and other objects, features and advantages will be apparent from the following more particular description of the preferred embodiments.

BRIEF DESCRIPTION OF THE INVENTION

Details of the invention will hereafter be described with respect to some examples of artificial high $T_c$ superconductor materials, with reference to the attached drawings in which.

DETAILED DESCRIPTION OF THE PREFERRED EMBODIMENTS

Figure 1:
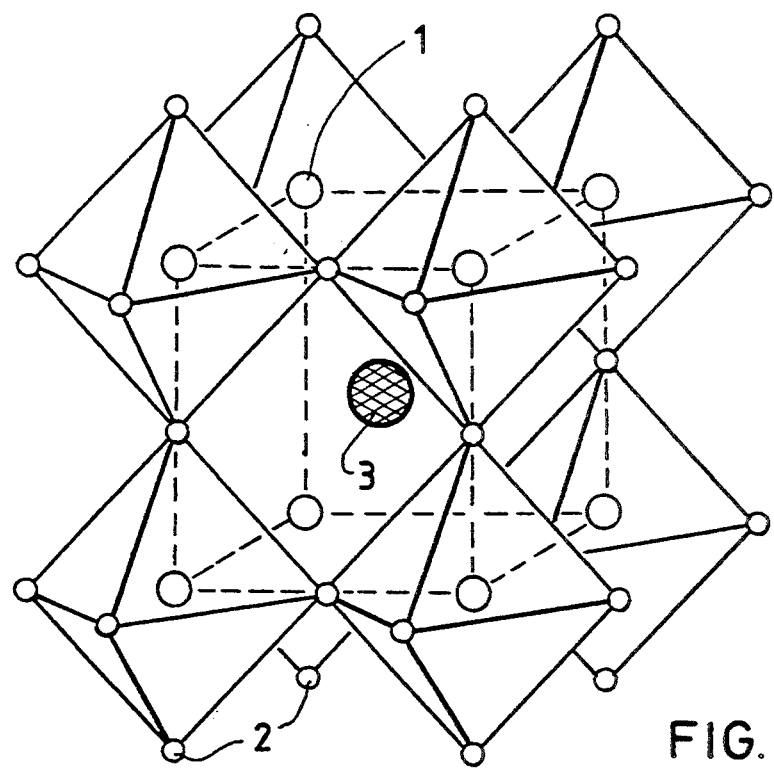
FIG. 1 shows the crystal lattice of strontium titanate $SrTiO_3$.

One material particularly suited as a substrate in the epitaxial growth of high $T_c$ superconductor material is strontium titanate, $SrTiO_3$, which forms crystals like perovskite (FIG. 1). Each titanium ion 1 is octahedrally surrounded by six oxygen ions 2, the bigger strontium ions 3 being disposed in the spaces in between. At room temperature, $SrTiO_3$ is cubic with a small unit cell, and paraelectric. At about 100° K., $SrTiO_3$ starts to undergo a cubic-tetragonal phase transition with a non-ferroelectric phase, because this phase is more favorable energetically.

Another material suitable as a substrate is zirconium dioxide $ZrO_2$. This material can even be coated over polycrystalline silicon bulk material, in order to minimize any mismatches in lattic constants.

Still another promising material is zinc selenide, $Zn_{1-x}Se_x$. By varying x, the lattice constant of this compound can be adjusted within certain borders, so as to render it essentially equal to the lattice constant of the high $T_c$ superconductor material to be grown.

Other examples of material suitable as substrates for the growth of high $T_c$ superconductor materials include barium fluoride, $BaF_2$, and II/VI compounds such as zinc telluride, $Zn_{1-x}Te_x$, and cadmium telluride, $Cd_{1-x}Te_x$.

Figure 2:
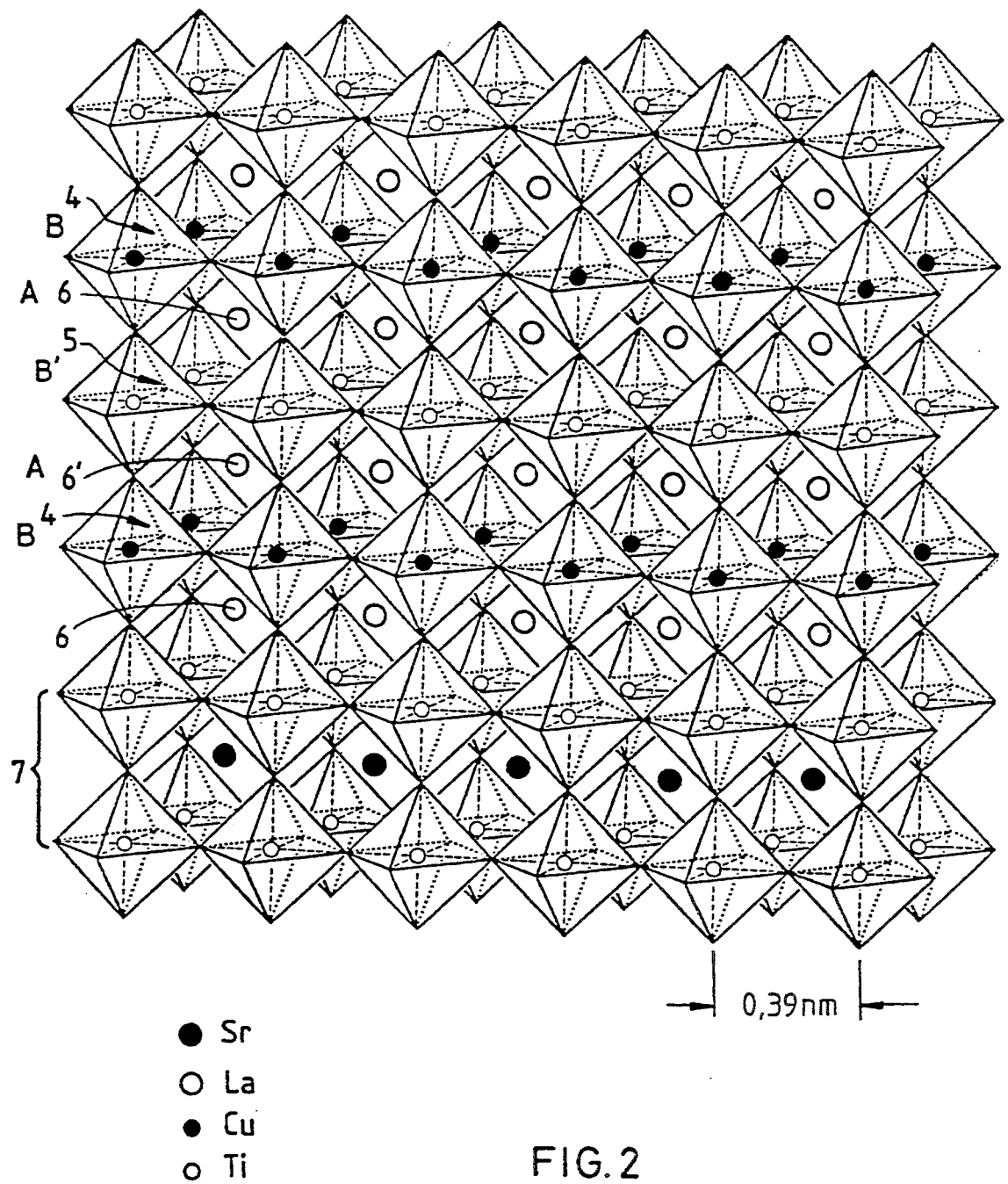
FIG. 2 illustrates the crystal structure of artificial $La_2CuTiO_6$.
Figure 3:
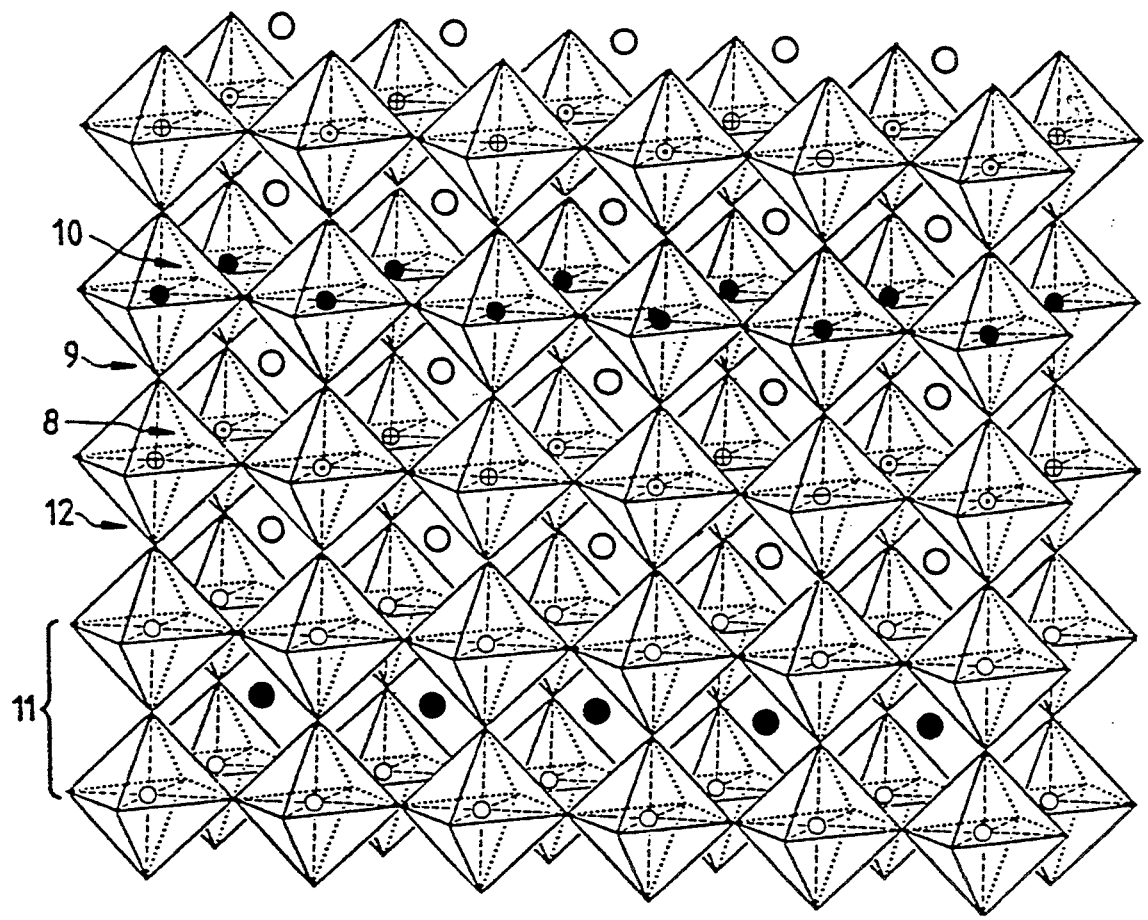
FIG. 3 depicts the crystal structure of artificial $La_2Cu(Al_{\frac{1}{2}}, Zr_{\frac{1}{2}})O_6$.
Figure 4:
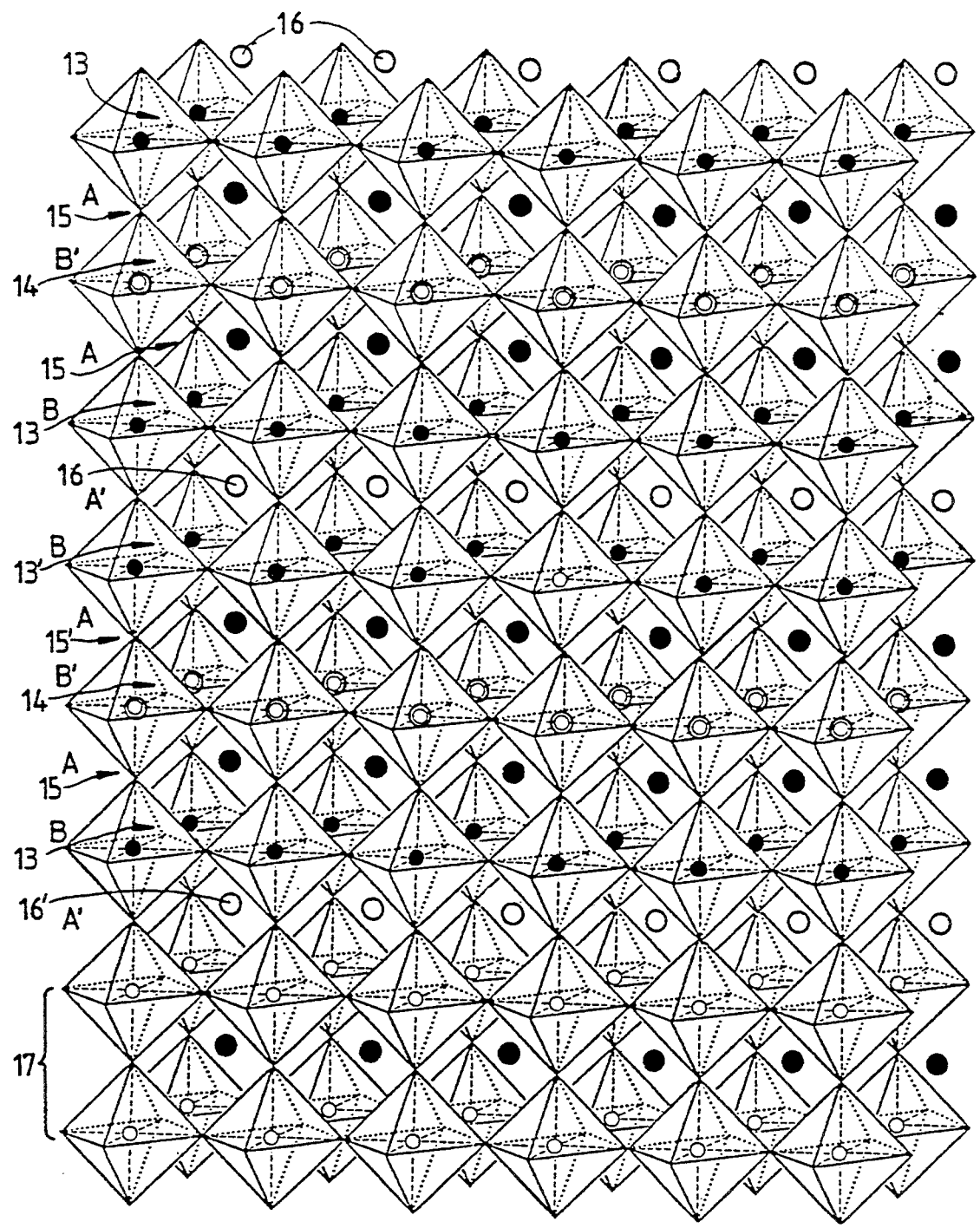
FIG. 4 shows the lattice structure of artificial $Sr_2LaCu_2WO_9$.

Returning to the manufacturing of artificial high $T_c$ superconductor materials, it has been found that one essential feature is the layered structure of the superconducting metal oxides. The monolayer epitaxy allows for the generation of such layers and for a systematic variation of the layer sequences and, most importantly, of the crystalline structure of those layers. FIGS. 2, 3, and 4 show examples of layered perovskite high $T_c$ superconductors that can be grown with single-valence or mixed-valence copper oxide layers separated by non-superconducting metal oxide layers.

Another essential feature of high $T_c$ perovskite copper oxide superconductors is the antiferromagnetic character of the non-conducting (i.e. undoped) oxide at low temperatures. The antiferromagnetic behavior is characterized by a state in which neighboring spins are antiparallel, instead of parallel. Accordingly, the non-conducting copper oxide exhibits a paramagnetism with low positive susceptibility that varies with temperature.

FIG. 2 is a representation of a crystal lattice of an artificial high $T_c$ superconductor compound manufactured in accordance with the present invention. The compound of $La_2CuTiO_6$. Its crystal structure is of the ABB' type and consists of a layer sequence comprising a (B) copper oxide layer 4, a (B') titanium oxide layer 5, and interstacked (A) lanthanum oxide layers 6,6'. The copper oxide and titanium oxide layers 4 and 5, respectively, consist of octahedra having metal atoms in their centers and shared oxygen atoms at their corners. The spaces between every four octahedra house one lanthanum atom 6 each. This crystal structure is grown on top of a $SrTiO_3$ crystal 7 which has essentially the same lattice constant as the desired superconductor material.

FIG. 3 shows an example of an ABB' structure of $La_2Cu(Al_{\frac{1}{2}}, Zr_{\frac{1}{2}})O_6$. The layer sequence consists of a mixed (B') $Al^{3+}/Zr^{4+}$ oxide layer 8, a (A) lanthanum oxide layer 9 and a (B) mixed-valence $Cu^{2+}/Cu^{3+}$ oxide layer 10. This lattice is grown on top of a $SrTiO_3$ crystal 11 with an interstacked lanthanum layer 12.

While the manufacture of one-constituent oxide layer is straightforward, the creation of oxide layers of the mixed $Al^{3+}/Zr^{4+}$ type requires the simultaneous presence of Al and Zr in a 1:1 relationship, preferably in the form of gaseous organic compounds of these metals. Examples of organic compounds useful in this connection are aluminum alkoxide $Al(OCH_3)_3$ and zirconium cyclopentadienyl $Zr(OC_2H_5)_2$.

Generally, the following types of metalorganic compounds may find use in connection with the present invention:

| | | |
|---|---|---|
| Halogenides | YCl$_3$ | Yttrium Chloride |
| Alkyls | (CH$_3$)$_3$La | Methyllanthanum |
| Alkoxides | Ba(OCH$_3$)$_2$ | Methoxybarium |
| Acetylacetones | Ba[OC(CH$_3$):CHCO(CH$_3$)]$_2$ | Barium acetylacetonate |
| Cyclopentadienyls | (C$_5$H$_5$)$_2$Ba | Barium cyclopentadienyl |
| Carbonyls | C$_5$H$_5$Mn(CO)$_3$ | Manganese cyclopentadien carbonyl |

An example of a crystal structure of the AA'BB' type is shown in FIG. 4. The superconductor material is Sr$_2$LaCu$_2$WO$_9$. The layer sequence consists of mixed (B)

$$Cu\frac{2.5+}{2}$$

and (B') W$^{6+}$ oxide layers 13, 13' and 14, respectively, separated alternatively by (A)

$$Sr\frac{2+}{2}$$

and (A') La$^{3+}$ oxide layers 15, 15' and 16, respectively. Again, the crystal lattice rests on top of a SrTiO$_3$ crystal 17 with an interstacked lanthanum layer 16'.

Figure 5:
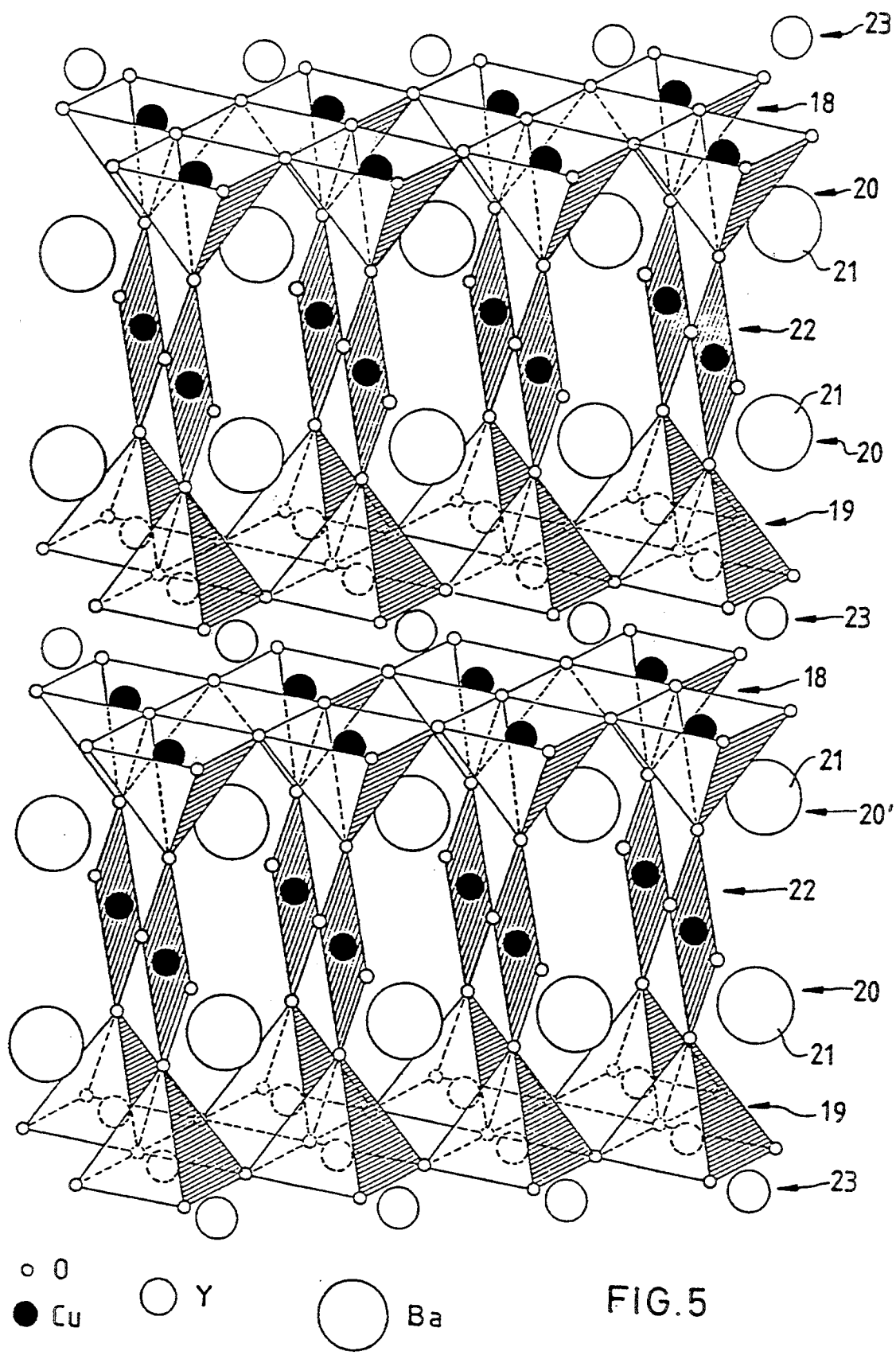
FIG. 5 shows the crystal structure of the orthorhombic form of $YBa_2Cu_3O_7$.

FIG. 5 shows another artificial superconductor compound in its orthorhombic form, viz. YBa$_2$Cu$_3$O$_7$. In contrast to the cubic perovskite structure with only corner-shared octahedra, in the compound of FIG. 5, corner-sharing square pyramid copper oxide layers 18 and 19 arranged opposite each other form rhombic spaces in which first and second layers 20, 20' of barium atoms 21 (forming barium oxide BaO) are disposed, separated by at least one other copper oxide layer 22 consisting of ribbons of square-planar CuO$_4$ polyhedra. Neighboring layers 18 and 19, respectively, comprising the pyramid shaped copper oxide are joined by interstacked planar layers 23 or yttrium oxide.

It has been found (T. Schneider and D. Baeriswil, Critical Temperature of High-T$_c$-Superconductors, Zeitschrift für Physik A,—to be published) that the critical temperature T$_c$ of superconductors of the type shown in FIG. 5 is dependent on the number n of interstacked copper oxide layers, T$_c$=f(n). This provides for the possibility of "engineering" the superconductor compounds so as to adapt their critical temperature to the needs of the particular circumstances by choosing the appropriate number of layers. Accordingly, in the compound shown in FIG. 5, more planar CuO$_4$ layers 22 may be added.

Figure 6:
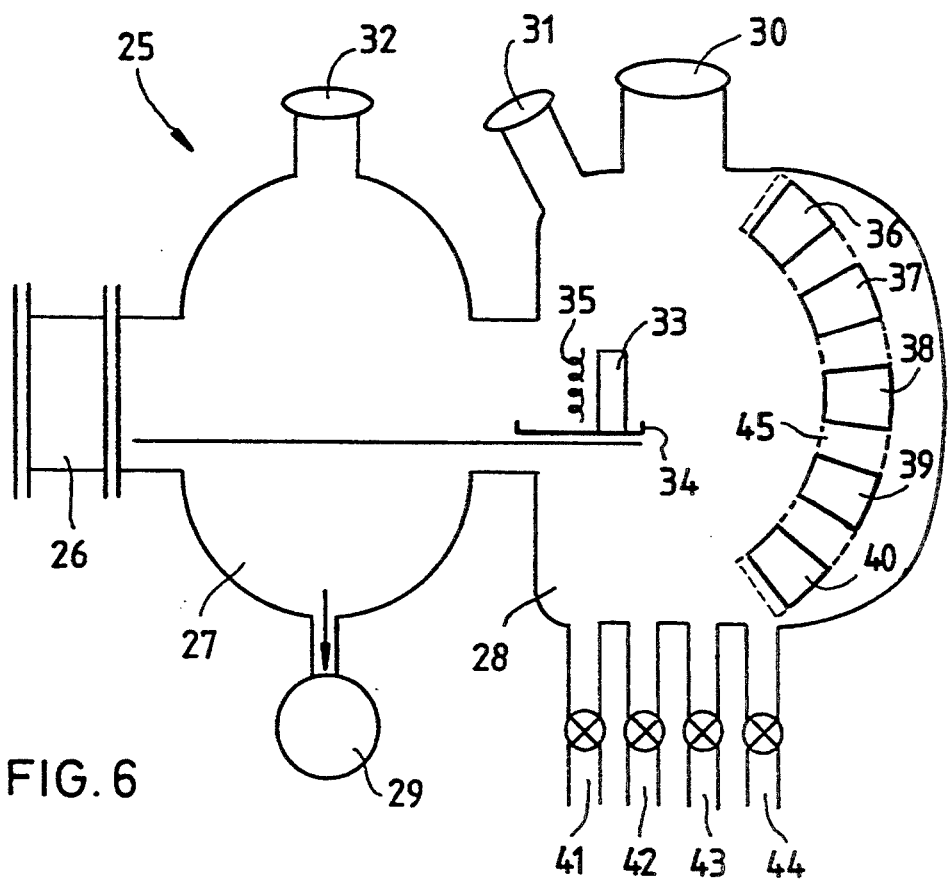
FIG. 6 is a schematic representation of epitaxy apparatus suited to create the artificial superconductor compounds in accordance with the invention.

Having described some examples of artificial high T$_c$ superconductors, the description will now turn to an apparatus (FIG. 6) for growing epitaxial layers. This is a typical set up and is basically a sophisticated extension of a vacuum evaporation apparatus comprising a multichamber vessel 25 having a fast entry load-lock 26, a preparation chamber 27 and a growth chamber 28. Vessel 25 can be pumped to ultra-high vacuum conditions (about 10$^{-9}$Pa) using a suitable combination of ion, cryo-, turbomolecular, diffusion, sorption and sublimation pumps 29. The use of UHV conditions enables the incorporation of high vacuum based surface analytical and diagnostic techniques. For example, reflection high energy electron diffraction (RHEED) apparatus 30 may be employed to examine the substrate prior to deposition, and the actual epitaxial film during deposition. A mass spectrometer 31 may be provided for monitoring the gas composition in growth chamber 28 and for detecting possible leaks. Other surface analysis instruments, such as an Auger electron spectroscope 32, may be placed in preparation chamber 27 to reduce contamination problems.

The monocrystalline substrate 33 is arranged on a trolley 34 which enables it to be moved between loadlock 26 and growth chamber 28, passing preparation chamber 27. Substrate 33 may be heated by a heating coil 35. Facing substrate 33 are a number of sources 36 through 40 from which different materials can be emitted in the epitaxy process. These individually shuttered sources may encompass, for example, evaporators heated resistivity or by electron beam, or sources for metals in the form of metal-organic compounds, or gas sources for performing dielectric, metal or metal oxide depositions. In addition, several gas inlets 41 through 44 are provided for introducing controlled amounts of known gases.

Substrate 33 is preferably oriented in a vertical direction to facilitate the deposition of materials from the beams emitted from sources 36 through 40. To maintain a constant distance of sources 36–40 from substrate 33, the sources may be arranged on a remote-controlled arcuate (or straight) slider 45.

In operation, after the monocrystalline substrate 33 is placed on trolley 34 and introduced into vessel 25, loadlock 26 is closed. After pumping to UHV conditions, substrate 33 is brought into position for deposition. The appropriate one of sources 36–40 is placed opposite substrate 33. After substrate 33 has reached its operative temperature, the shutters of the first set of sources are opened, and/or the appropriate gas inlet(s) is operated, for a predetermined period of time. The first part of the epitaxy cycle is completed when a monoatomar or monomolecular layer of the first constituent has settled on the substrate.

The second part of the epitaxy cycle is started as soon as there is no residue left in the vacuum of the preceding source material. Then the second set of source is activated for the appropriate period of time so as to permit the second source material to react with the first source material as determined by the stoichiometry of the materials in question.

This procedure is repeated for all individual constituents the deposit is finally to contain, and the entire cycle is repeated for each additionally desired layer of the superconductor material.

Over any other methods of the creation of chemical compounds, the monolayer epitaxy process has the advantage that it permits the formation of artificial compounds, i.e. those that do not exist in nature, on top of seed crystals having essentially the same lattice structure as the compounds desired. This is in contrast to other deposition methods by which only polycrystalline, or bulk materials can be obtained. In view of the fact that a layered structure is an essential feature of all high-T$_c$ superconductors, the inventive method is of great importance in the manufacture of these superconductors.

While the invention has been described with respect to particular embodiments thereof, it will be appreciated by those of skill in the art that variations thereof can be made that are constituent with the scope and concept of the present invention. For example, the types of high $T_c$ superconductors made by this technique can be varied greatly in terms of composition and structure in order to achieve specialized operating results and properties.

Having thus described our invention, what we claim as new and desire to secure by Letters Patent is:

1. A method for making artificial, layered high $T_c$ superconductor compounds by monolayer epitaxy, comprising the following steps:

placing a monocrystalline substrate of a material from the group comprising strontium titanate $SrTio_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, said constituent materials being deposited one at a time, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to settle on the current substrate surface;

determining the operating temperature at which the exposure is to be performed by monitoring, prior to said exposure, the operating temperature of the current substrate surface, monitoring, prior to said exposure the operating temperature of the source of the particular constituent material and from the reaction temperature required for the desired high $T_c$ superconductor material to form in accordance with a particular, desired crystal structure;

repeating the preceding steps as often as corresponds to the number of monomolecular/monoatomar layers the final superconductor compound should contain;

cooling the resulting crystal to ambient temperature and removing it from said chamber.

2. The method of claim 1, wherein the epitaxial deposition of at least part of said constituent materials is made from a gas phase.

3. A method for making artificial, layered high $T_c$ superconductor compounds by monolayer epitaxy, comprising the following steps:

placing a monocrystalline substrate of a material from the group comprising strontium titanate $SrTio_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to deposit on the current substrate surface;

determining the operating temperature at which the exposure is to be performed by monitoring the operating temperature of the current substrate surface, monitoring, prior to said exposure the operating temperature of the source of the particular constituent material and from the reaction temperature required for the desired high $T_c$ superconductor material to form in accordance with a particular, desired crystal structure; p1 repeating the preceding steps as often as corresponds to the number of monomolecular/monoatomar layers the final superconductor compound should contain;

cooling the resulting crystal to ambient temperature and removing it from said chamber; and said gas phase contains the metal atoms to be deposited in the form of an organic compound of the particular metal.

4. The method of claim 1, characterized in that the epitaxial deposition of said constituent materials is made from at least one molecular beam of the particular material(s).

5. A method for making artificial, layered high $T_c$ superconductor compounds by monolayer epitaxy, comprising the following steps:

placing a monocrystalline substrate of a material from the group comprising strontium titanate $SrTio_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to deposit on the current substrate surface;

determining the operating temperature at which the exposure is to be performed by monitoring, prior to said exposure the operating temperature of the current substrate surface, monitoring prior to said exposure the operating temperature of the source of the particular constituent material and monitoring prior to said exposure the reaction temperature required for the desired high $T_c$ superconductor material to form in accordance with a particular, desired crystal structure;

repeating the preceding steps as often as corresponds to the number of monomolecular/monoatomar layers the final superconductor compound should contain;

cooling the resulting crystal to ambient temperature and removing it from said chamber; and said monocrystalline substrate contains of octahedral strontium titanate $SrTiO_3$, that in a first epitaxial operation a first monomolecular layer of lanthanum oxide $La_2O_3$ is deposited onto said strontium titanate substrate, that in a second epitaxial operation a layer of octahedral cuprous oxide $Cu_2O$ is deposited onto said lanthanum oxide monolayer, that in a third epitaxial operation a second monolayer of lanthanum oxide $La_2O_3$ is deposited onto said cuprous oxide layer, that in a fourth epitaxial operation a monolayer of octahedral titanium dioxide $TiO_2$ is deposited onto said second lanthanam oxide monolayer, the four individual epitaxial operations being performed under controlled conditions regarding time of exposure, concentration of epitaxial source material, and reaction temperature so as to permit the nascent $la_2CuTiO_6$ crystal to be stoichiometrically correct and to assume a layered, ocathedral structure of the ABB' type.

6. The method of claim 5, characterized in that said sequence of four epitaxial deposition operations is repeated as many times as the desired thickness of the resulting superconductor compound requires.

7. A method for making artificial, layered high $T_c$ superconductor compounds by monolayer epitaxy, comprising the following steps:

placing a monocrystalline substrate of a material from the group comprising strontium titanate $SrTio_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to deposit on the current substrate surface;

determining the operating temperature at which the exposure is to be performed by monitoring prior to said exposure the operating temperature of the current substrate surface, monitoring prior to said exposure the operating temperature of the source of the particular constituent material and monitoring prior to said exposure the reaction temperature required for the desired high $T_c$ superconductor material to form in accordance with a particular, desired crystal structure;

repeating the preceding steps as often as corresponds to the number of monomolecular/monoatomar layers the final superconductor compound should contain;

cooling the resulting crystal to ambient temperature and removing it from said chamber; and said monocrystalline substrate consists of octahedral strontium titanate $SrTiO_3$, that in a first epitaxial operation a monomolecular layer of lanthanum oxide $La_2O_3$ is deposited onto said substrate, that in a second epitaxial operation a monolayer of mixed aluminum oxide $Al_2O\ 3+/3\times$ and zirconium oxide $Zr^{4+}O_2$ is deposited onto said layer of lanthanum oxide, that in a third epitaxial operation a second layer of lanthanum oxide $La_2O_3$ is deposited onto said monolayer of mixed oxides, and that in a fourth epitaxial operation octahedral cuprous oxide $Cu_2O$ is deposited onto said second monolayer of lanthanum oxide, the four individual epitaxial operations being performed under controlled conditions regarding time of exposure, concentration of epitaxial source material, and reaction temperature so as to permit the nascent $La_2Cu(Al_{\frac{1}{2}},Zr_{\frac{1}{2}})O_6$ crystal to be stoichiometrically correct and to assume a layered, octahedral structure of the ABB' type.

8. A method for making artificial, layered high $T_c$ superconductor compounds by monolayer epitaxy, comprising the following steps:

placing a monocrystalline substrate of a material from the group comprising strontium titanate $SrTio_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to deposit on the current substrate surface;

determining the operating temperature at which the exposure is to be performed by monitoring prior to said exposure the operating temperature of the current substrate surface, monitoring prior to said exposure the operating temperature of the source of the particular constituent material and monitoring prior to said exposure the reaction temperature required for the desired high $T_c$ superconductor material to form in accordance with a particular, desired crystal structure;

repeating the preceding steps as often as corresponds to the number of monomolecular/monoatomar layers the final superconductor compound should contain;

cooling the resulting crystal to ambient temperature and removing it from said chamber; and said monocrystalline substrate consists of octahedral strontium titanate $SrTio_3$, that in a first epitaxial operation a first monomolecular layer of lanthanum oxide $La_2O_3$ is deposited onto said monocrystalline substrate, that in a second epitaxial operation a first monomolecular layer of octahedral cuprous oxide $Cu_2O$ is deposited on to said lanthanum oxide layer, that in a third epitaxial operation a first monomolecular layer of strontium oxide SrO is deposited onto said monolayer of cuprous oxide, that in a fourth epitaxial operation a first monomolecular layer of tungstic oxide $WO_3$ is deposited onto said first strontium oxide monolayer, that in a fifth epitaxial operation a second monomolecular layer of strontium oxide SrO is deposited onto said monomolecular layer of tungstic oxide, that in a sixth epitaxial operation a second monomolecular layer of octahedral cuprous oxide $Cu_2O$ is deposited onto said second strontium oxide layer, and that in a seventh epitaxial operation a second monomolecular layer of lanthanum oxide LaO is deposited onto said cuprous oxide layer, the seven individual epitaxial operations being performed under controlled conditions regarding time of exposure, concentration of epitaxial source material, and reaction temperatures so as to permit the nascent $Sr_2LaCu_2WO_9$ crystal structure of the AA'B type.

9. A method for making artificial, layered high $T_c$ superconductor compounds by monolayer epitaxy, comprising the following steps:

placing a monocrystalline substrate of a material from the group comprising strontium titanate $SrTiO_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to deposit on the current substrate surface;

determining the operating temperature at which the exposure is to be performed by monitoring prior to said exposure the operating temperature of the current substrate surface, monitoring prior to said exposure the operating temperature of the source of the particular constituent material and monitoring prior to said exposure the reaction temperature required for the desired high $T_c$ superconductor material to form in accordance with a particular, desired crystal structure;

repeating the preceding steps as often as corresponds to the number of monomolecular/monoatomar layers the final superconductor compound should contain;

cooling the resulting crystal to ambient temperature and removing it from said chamber; and said monocrystalline substrate consists of octahedral strontium titanate $SrTiO_3$, that in a first epitaxial operation a first monomolecular layer of yttrium oxide $Y_2O_3$ is deposited onto said monocrystalline substrate, that in a second epitaxial operation a first monomolecular layer of pyramidic cuprous oxide $Cu_2O$ is deposited onto said yttrium oxide layer, that in a third epitaxial operation a first monomolecular layer of barium oxide BaO is deposited onto said monolayer of cuprous oxide $Cu_2O$, that in a fourth epitaxial operation a layer of ribbon of square planar copper oxide $CuO_4$ polyhedra is deposited onto said barium oxide layer, that in a fifth epitaxial operation a second monomolecular layer of barium oxide BaO is deposited onto said layer of copper oxide polyhedra, that in a sixth epitaxial operation a second monomolecular layer of pyramidic cuprous oxide $Cu_2O$ is deposited onto said second barium oxide layer, and that in a seventh epitaxial operation a second monomolecular layer of yttrium oxide is deposited onto said cuprous oxide layer, the seven individual epitaxial operations being performed under controlled conditions regarding time of exposure, concentration of epitaxial source material, and reaction temperature, so as to permit the nascent $YBa_2Cu_3O_7$ crystal to be stoichiometrically correct and to assume a layered, orthorhombic structure.

10. The method of claim 9, characterized in that said first and second monolayers of yttrium oxide have a square planar structure.

11. The method of claim 9, characterized in that said $YBa_2Cu_3O_7$ crystal comprises at least two orthorhombic lattices consisting of $Ba_2Cu_3O_5$ with an interstacked square planar yttrium oxide $Y_2O_3$ layer.

12. The method of claim 9, characterized in that said cycle of seven epitaxial deposition steps is repeated as often as the desired thickness of the resulting layered structure requires.

13. The method of claim 9, characterized in that said fourth epitaxial deposition step in which a layer of copper oxide $CuO_4$ is deposited, is repeated at least once prior to continuing with the fifth step of deposition to create a layered structure comprising more than one layer of copper oxide $CuO_4$ between consecutive layers of barium oxide BaO.

14. A method for making a layered high $T_c$ superconductor by monolayer deposition, comprising the steps of:

placing a substrate in a chamber, said substrate having a desired crystallographic structure allowing substantial lattice matching to said superconductor, therebeing a plurality of sources in said chamber for providing the constituents of said superconductor, heating at least one of said sources to vaporize said source and to cause the constituent in said source to be deposited on said substrate as a monoatomar or monomolecular layer thereon heating in a sequence others of said sources to vaporize said sources for deposition onto said substrate of others of said constituents as monoatomar or monomolecular layers thereon, said constituents being deposited one at a time, repeating said preceding two heating steps to deposit additional monoatomar or monomolecular layers on said substrate until the desired final superconductor is formed.

15. The method of claim 14, wherein a gas stream including oxygen is introduced into said chamber, said vaporization then forming monomolecular oxide layers on said substrate.

16. The method of claim 14, wherein said sources include the metal constituents to be present in said superconductor.

17. The method of claim 14, wherein said superconductor contains Cu-O planes.

18. The method of claim 17, where said monoatomar or monomolecular layers are epitaxially formed on said substrate.

19. A method for making artificial, layered high $T_c$ superconductor compounds by monolayer epitaxy, comprising the following steps:

placing a monocrystalline substrate of a material from the group comprising strontium titanate $SrTio_3$, zirconium dioxide $ZrO_2$, zinc telluride $Zn_{1-x}Se_x$, barium fluoride, $BaF_2$, cadmium selenide $Cd_{1-x}$, and cadmium telluride $Cd_{1-x}Te_x$, wherein $x<1$, in a chamber having a plurality of independent sources of materials for epitaxial deposition, exposing said substrate in a sequence to as many different ones of said sources of constituent materials as the superconductor compounds being made should contain, activating said sources in accordance with a pattern of activity, said pattern involving determining which particular constituent material is to be deposited at any one time;

determining the amount and concentration of the particular constituent material to be emitted from said activated source determining the period of time the exposure of said substrate to the individual constituent materials should last for one monoatomar/monomolecular layer of the particular constituent material to deposit on the current substrate surface;

determining the operating temperature at which the exposure is to be performed by monitoring prior to said exposure the operating temperature of the current substrate surface, monitoring prior to said exposure the operating temperature of the source of the particular constituent material and monitoring prior to said exposure the reaction temperature required for the desired high $T_c$ superconductor material to form in accordance with a particular, desired crystal structure;

repeating the preceding steps as often as corresponds to the number of monomolecular/monoatomar layers the final superconductor compound should contain;

cooling the resulting crystal to ambient temperature and removing it from said chamber;

said superconductor contains Cu-O planes; and wherein the sequence of heating steps deposits monoatomar of monomolecular layers in a sequence other than that naturally occurring.

20. The method of claim 19, wherein said superconductor has an artificial crystallographic structure.

* * * * *